(12) United States Patent
Morthier et al.

(10) Patent No.: US 8,599,478 B2
(45) Date of Patent: Dec. 3, 2013

(54) ALL-OPTICAL 2R REGENERATION

(75) Inventors: Geert Morthier, Ghent (BE); Koen Huybrechts, Broechem (BE)

(73) Assignees: IMEC, Leuven (BE); Universiteit Gent, Ghent (BE)

(*) Notice: Subject to any disclaimer, the term of this patent is extended or adjusted under 35 U.S.C. 154(b) by 650 days.

(21) Appl. No.: 12/880,902

(22) Filed: Sep. 13, 2010

(65) Prior Publication Data

US 2011/0222856 A1    Sep. 15, 2011

(30) Foreign Application Priority Data

Mar. 15, 2010   (JP) .................................. 2010-58091

(51) Int. Cl.
*H01S 5/06* (2006.01)

(52) U.S. Cl.
USPC .......................................... 359/344; 398/175

(58) Field of Classification Search
USPC ..................................... 359/348, 344; 398/175
See application file for complete search history.

(56) References Cited

U.S. PATENT DOCUMENTS

| | | | |
|---|---|---|---|
| 4,812,776 A * | 3/1989 | Sasaki ............................ | 359/336 |
| 6,608,854 B1 * | 8/2003 | Watanabe ....................... | 372/96 |
| 6,832,053 B2 | 12/2004 | Leuthold | |
| 7,274,010 B2 * | 9/2007 | Matsuda et al. ........ | 250/214 LA |
| 7,508,576 B2 * | 3/2009 | Liu et al. ...................... | 359/334 |
| 7,864,412 B2 * | 1/2011 | Matsuda et al. .............. | 359/344 |
| 2008/0174856 A1 * | 7/2008 | Matsuda et al. .............. | 359/337 |

FOREIGN PATENT DOCUMENTS

JP    2008181930 A  *  8/2008

OTHER PUBLICATIONS

Huybrechts, K. et al., "All-Optical 2R Regeneration and Wavelength Conversion at 10Gb/s Using a Single Bistable DFB Laser Diode", International Conference on Photonics in Switching, Sep. 15-19, 2009, Pisa, Italy, 3 pages.
Rochette, Martin et al., "2R Optical Regeneration: An All-Optical Solution for BER Improvement", IEEE Journal of Selected Topics in Quantum Electronics, vol. 12, No. 4, Jul./Aug. 2006, pp. 736-744.
Huybrechts, K. et al., "All-Optical 2R Regeneration Using the Hysteresis in a Disturbed Feedback Laser Diode", IEEE Journal of Selected Topics in Quantum Electronics, 2009, pp. 1-7.

* cited by examiner

*Primary Examiner* — Mark Hellner
(74) *Attorney, Agent, or Firm* — McDonnell Boehnen Hulbert & Berghoff LLP (57) ABSTRACT

A method is provided for all-optical regeneration of intensity modulated optical signals. A DFB laser diode is selected such that it has a gain bandwidth comprising the signal wavelength, the signal wavelength being outside the stopband of the DFB laser diode. Furthermore, the DFB laser diode is selected such that it can have a bistable amplification characteristic for the signal wavelength showing a hysteresis with an ascending branch and a descending branch, the ascending branch located at a higher input power level than the descending branch. The DFB laser diode is driven such that it operates in the bistable amplification regime, the descending branch of the hysteresis curve located at an input power level above the lower power level of the optical signal pulses and the ascending branch of the hysteresis curve located at an input power level below the upper power level of the optical signal pulses.

14 Claims, 11 Drawing Sheets

ALL-OPTICAL 2R REGENERATION

CROSS-REFERENCE TO RELATED APPLICATIONS

The present application claims priority to Japanese Patent Application JP 2010 58091, filed in the JPO Patent Office on Mar. 15, 2010, the entire contents of which is incorporated herein by reference.

BACKGROUND

1. Field of the Invention

This invention relates to devices and methods for all-optical signal regeneration in optical communication systems.

2. Description of the Related Art

The telecommunication industry has experienced large growth in the last few years and the need for bandwidth is expected to increase further as new Internet-based services are being implemented. Optical point-to-point wavelength-division-multiplexed (WDM) network links were able to fulfill the capacity requirements in the past and have been implemented world-wide. To meet future demand, a next step in optical network evolution will be to implement the routing and switching in the optical domain. A major concern, however, is the accumulation of noise which severely limits the cascadability of optical network nodes.

It is known to regenerate optical signals using opto-electronic regenerators. Such opto-electronic generators are based on a receiver, electronic regeneration, and an optical transmitter.

In addition, different techniques for all-optical 2R regeneration (2R: providing reamplification and reshaping) have been proposed. The main mechanism of such all-optical regenerators is based on a nonlinear power transfer function. A first category of all-optical regenerators provides regeneration both at the upper power level (logical one) and at the lower power level (logical zero) of the optical signal pulses. The regeneration mechanism can be based on a single power transfer function, wherein a same power transfer function is used for the upper power level (logical one) and for the lower power level (logical zero). For example, interferometric regenerators are based on a single power transfer function. Alternatively, the regeneration mechanism can be based on using different power transfer functions for the upper power level and for the lower power level. Such all-optical regenerators can provide a bit error rate (BER) reduction. An example of this type of all-optical regenerators is the so-called Mamyshev-type regenerator. A second category of all-optical regenerators provides regeneration only at the upper power level or only at the lower power level of the optical signal. Such regenerators can be based on devices having a saturation characteristic. For example, semiconductor optical amplifiers can be used to provide regeneration at the upper power level (logical one) of an optical signal.

Mamyshev type all-optical regenerators are based on self-phase modulation of an optical data signal in a nonlinear medium such as a non-linear fiber, with subsequent optical filtering. This type of optical regenerators results in a very good regeneration, but requires a very high input power (e.g. average input power higher than 100 mW) and only works for short pulses. They are generally rather bulky and require long fiber lengths. It has been shown (M. Rochette et al., "2R Optical Regeneration: An All-Optical Solution for BER Improvement", IEEE Journal of Selected Topics in Quantum Electronics, Vol. 12, No. 4, 2006) that the BER can be improved using this type of regenerator.

An example of an interferometric all-optical regenerator is described in U.S. Pat. No. 6,832,053. Usually this type of all-optical regenerator works with much lower power levels (as compared to Mamyshev type regenerators), e.g. with input power levels in the 1 mW to 2 mW range. However, the quality of the regeneration is worse (e.g. only noise redistribution but no actual BER improvement) and their structure, fabrication, and operation is rather complicated.

In U.S. Pat. No. 6,608,854 a device and a method for all-optical waveform reshaping of optical signals is described, based on gain saturation of an optical amplifier. The device for waveform reshaping includes a distributed feedback (DFB) laser and a drive circuit for supplying a drive current to the DFB laser such that the DFB laser oscillates at a first wavelength included in the stop band. Signal light having a second wavelength not included in the stop band is input into the DFB laser. When the signal light comprises optical pulses each having an upper power level and a lower power level, amplitude fluctuations at the upper level can be suppressed by suitably setting the power of the signal light. Waveform shaping of the optical signal is based on gain saturation of the DFB laser, acting as an optical amplifier. It is shown that amplitude fluctuations at the lower power level can be suppressed by providing an additional component, e.g. a saturable absorber. The input power level needed for this type of optical regenerators can be low, but the regeneration only provides noise redistribution and no BER improvement.

SUMMARY

The present disclosure is directed to a method for all-optical 2R regeneration of intensity modulated optical signals, wherein the method can be performed with a low power consumption and wherein the method provides a good signal regeneration including bit error rate (BER) reduction.

Particular and preferred aspects of the embodiments are set out in the accompanying independent and dependent claims. Features from the dependent claims may be combined with features of the independent claims as appropriate and not merely as explicitly set out in the claims.

The present disclosure provides a method for all-optical regeneration of an optical signal comprising pulses having an upper power level and a lower power level, the optical signal having a signal wavelength, wherein the method comprises: providing a DFB laser diode having a gain bandwidth comprising the signal wavelength, wherein the signal wavelength is outside the stopband of the DFB laser diode, the DFB laser diode having a bistable amplification characteristic for the signal wavelength showing a hysteresis curve with an ascending branch and a descending branch, the ascending branch being located at a higher input power level than the descending branch; driving the DFB laser diode such that it operates in the bistable amplification regime, wherein the descending branch of the hysteresis curve is located at an input power level above the lower power level of the pulses and wherein the ascending branch of the hysteresis curve is located at an input power level below the upper power level of the pulses; and providing the optical signal at an input of the DFB laser diode, thereby generating a regenerated optical signal at an output of the DFB laser diode.

In embodiments of the present disclosure, providing a DFB laser diode comprises providing a DFB laser diode having at each facet an antireflection coating with a reflectivity that is sufficiently low for enabling bistable amplification at the signal wavelength. Preferably the reflectivity of the antireflection coating at both facets of the laser diode is lower than 5%, preferably lower than 3%, more preferred lower than 2%, still more preferred lower than 1%.

In embodiments of the present disclosure, driving the DFB laser diode comprises providing an injection current that is sufficiently high for enabling bistable amplification, for example an injection current that is at least three times higher, preferably at least four times higher, than the threshold current of the DFB laser diode.

A method according to embodiments of the present disclosure may further comprise providing a continuous optical signal at the input of the DFB laser diode, e.g. for increasing the input power level such that the descending branch of the hysteresis curve is located at an input power level above the lower power level of the pulses and such that the ascending branch of the hysteresis curve is located at an input power level below the upper power level of the pulses.

A method according to embodiments of the present disclosure may further comprise filtering the output signal of the DFB laser diode, for example by providing an optical filter at the output of the DFB laser diode, thereby removing the lasing wavelength of the DFB laser diode from the output signal such that only the regenerated optical signal passes the optical filter.

The present disclosure also relates to an all-optical signal regenerator using a DFB laser diode in accordance with a method of the present disclosure. The present disclosure provides an all-optical regenerator for regenerating an optical signal comprising pulses having an upper power level and a lower power level, the optical signal having a signal wavelength, wherein the regenerator comprises: a DFB laser diode having a gain bandwidth comprising the signal wavelength, wherein the signal wavelength is outside the stopband of the DFB laser diode, the DFB laser diode having a bistable amplification characteristic for the signal wavelength showing a hysteresis curve with an ascending branch and a descending branch, the ascending branch being located at a higher input power level than the descending branch; a drive circuit for supplying a drive current to the DFB laser diode such that it operates in the bistable amplification regime, wherein the descending branch of the hysteresis curve is located at an input power level above the lower power level of the pulses and wherein the ascending branch of the hysteresis curve is located at an input power level below the upper power level of the pulses.

The present disclosure also relates to a multi-channel all-optical regenerator comprising an input multiplexer, an array of all-optical signal regenerators comprising a DFB laser diode and a drive circuit according to the present disclosure, and an output multiplexer.

It is an advantage of a method and a device for all-optical 2R signal regeneration according to the present disclosure that the power consumption can be low. For example, the power consumption can be lower than 1 Watt, including the power consumption for cooling the DFB laser diode used as an optical regenerator and including the power consumption of an EDFA (Erbium Doped Fiber Amplifier) shared between different wavelength channels in case of a multi channel configuration. The optical input power level can be low, e.g. in the range of a few mW or less.

It is an advantage of a method and a device for all-optical 2R signal regeneration according to the present disclosure that it provides good signal regeneration with suppression of amplitude variations in the upper power level (logical one) and in the lower power level (logical zero) of the optical signals and with significant BER reduction before and after reaching the BER floor resulting from optical noise.

It is an advantage of a device for all-optical 2R signal regeneration according to the present disclosure that it is a compact device, e.g. having lateral dimensions in the range of a few 100 micrometers.

It is an advantage of a method and a device for all-optical 2R signal regeneration according to the present disclosure that it can be used in a broad wavelength range, for example in a wavelength range with a width of 30 nm to 40 nm. The method can be used at any wavelength within the gain bandwidth of the active material of the DFB laser diode, except for a small range close to (e.g. within 1 nm of) the laser wavelength.

It is an advantage of a method and a device according to the present disclosure that it can be polarization independent, for example by using a polarisation independent waveguide design known by a person skilled in the art.

It is an advantage of a method and a device according to the present disclosure that it can be used in a broad range of bitrates, e.g. for bitrates of 40 GHz and below, e.g. 25 GHz and below.

It is an advantage of a method and a device for all-optical 2R signal regeneration of the present disclosure that it can be used for optical regeneration of NRZ (Non Return to Zero) signals.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the invention as claimed. The invention, both as to organization and method of operation, together with features and advantages thereof, may best be understood by reference to the following detailed description when read in conjunction with the accompanying drawings.

BRIEF DESCRIPTION OF THE DRAWINGS

FIG. 1(a) shows the laser output power as a function of the power of the injected light. FIG. 1(b) illustrates the bistability of the amplification of the injected light.

FIG. 4(a) shows the original bit pattern; FIG. 4(b) shows the degraded bit pattern with a dynamically changing decision level (short dashes) and with a static decision level (long dashes); FIG. 4(c) shows the reconstructed or regenerated bit pattern based on the static decision level; FIG. 4(d) shows the regenerated bit pattern based on the dynamic decision level.

FIG. 7(a): EDFA input power −25.2 dBm; FIG. 7(b): EDFA input power −26.2 dBm; FIG. 7(c): EDFA input power −27.2 dBm.

FIG. 9(a) shows the eye diagram of an original signal at the receiver; FIG. 9(b) shows the eye diagram of the degraded signal; FIG. 9(c) shows the eye diagram of the regenerated signal.

FIG. 11(a): wavelength 1545 nm; FIG. 11(b): wavelength 1550 nm; FIG. 11(c): wavelength 1555 nm.

FIG. 12(a) with an input OSNR of 17.6 dB (being improved to 19.8 dB); FIG. 12(b) with an input OSNR of 16.9 dB (being improved to 19.2 dB).

DETAILED DESCRIPTION

In the following detailed description, numerous specific details are set forth in order to provide a thorough understanding of the disclosed embodiments and how they may be practiced. However, it will be understood that the present invention may be practiced without these specific details. In other instances, well-known methods, procedures and techniques have not been described in detail, so as not to obscure the present invention. While the present disclosure will be described with respect to particular embodiments and with reference to certain drawings, the invention is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, the stopband of a DFB laser diode is the wavelength band around the Bragg wavelength (being determined by the Bragg grating period) in which the Bragg grating provides significant reflection, leading to laser oscillation.

In the context of the present disclosure, the gain bandwidth is the wavelength band over which the active layer of the DFB laser diode provides amplification or gain due to population inversion.

The present disclosure provides a method for all-optical 2R signal regeneration of intensity modulated optical signals with low power consumption and allowing good signal regeneration with bit error rate (BER) reduction.

The present disclosure provides a method for all-optical regeneration of intensity modulated optical signals, the optical signals having a signal wavelength and comprising pulses having an upper power level and a lower power level. In embodiments of the present disclosure a DFB laser diode is used for optical regeneration. The DFB laser diode is selected such that it has a gain bandwidth comprising the signal wavelength, the signal wavelength being outside the stopband of the DFB laser diode. Furthermore, the DFB laser diode is selected such that it can have a bistable amplification characteristic for the signal wavelength, the bistable amplification characteristic showing a hysteresis with an ascending branch and a descending branch, the ascending branch being located at a higher input power level than the descending branch. In a method according to the present disclosure, the DFB laser diode is driven such that it operates in the bistable amplification regime, wherein the descending branch of the hysteresis curve is located at an input power level above the lower power level of the pulses and wherein the ascending branch of the hysteresis curve is located at an input power level below the upper power level of the pulses. The optical signal to be regenerated is provided at an input of the DFB laser diode, thereby generating a regenerated optical signal at an output of the DFB laser diode.

The method of the present disclosure uses the hysteresis in the transmission characteristic of a DFB laser diode when it is used to amplify light with a wavelength outside the stopband of the DFB laser diode.

Figure 1:
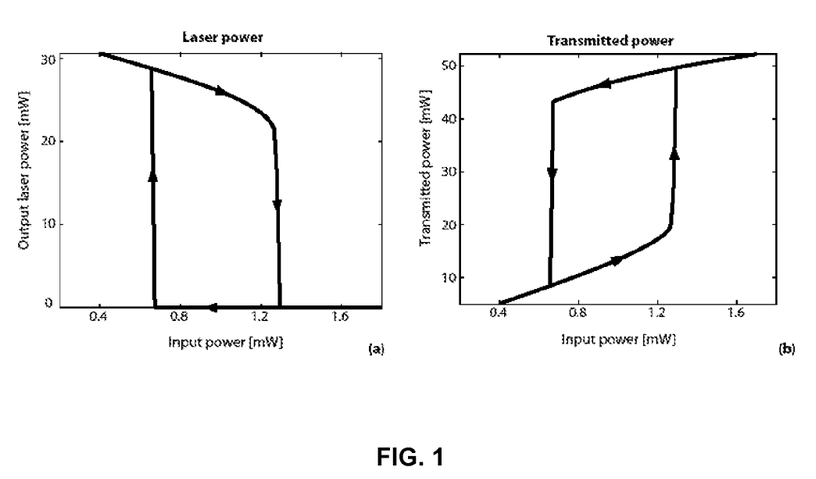
FIG. 1 illustrates the bistability of a DFB laser diode.

It is known that a distributed feedback (DFB) laser diode can show a hysteresis in the lasing power and in the amplification characteristic under the injection of a holding beam. When injecting continuous-wave light into a DFB laser, two stable states are possible for the same input power. This bistability arises from the strong influence of the carrier distribution on the threshold characteristics of a DFB laser. In one of the states the laser is lasing and the externally injected light is weakly amplified due to gain clamping. The other state has a very high amplification of the external light, resulting in a strong nonuniform distribution of carriers. This spatial hole burning effect can increase the threshold of a DFB laser diode, ultimately causing the laser to switch off. In that state all the injected carriers in the device are used to amplify the injected light. FIG. 1(a) shows the simulated laser output power as a function of the power of the injected light for a lambda/4 shifted DFB laser with antireflection coatings, a corrugation κL of 1.2 and a length L of 400 micrometer. FIG.

1(b) illustrates the bistability of the amplification of the injected light. This bistable amplification characteristic is used in a method according to the present disclosure to obtain good optical regeneration with BER. As can be seen in FIG. 1(b), the amplification characteristic shows a counter-clockwise hysteresis curve, having an ascending branch that is located at a higher input power level than the descending branch.

Figure 2:
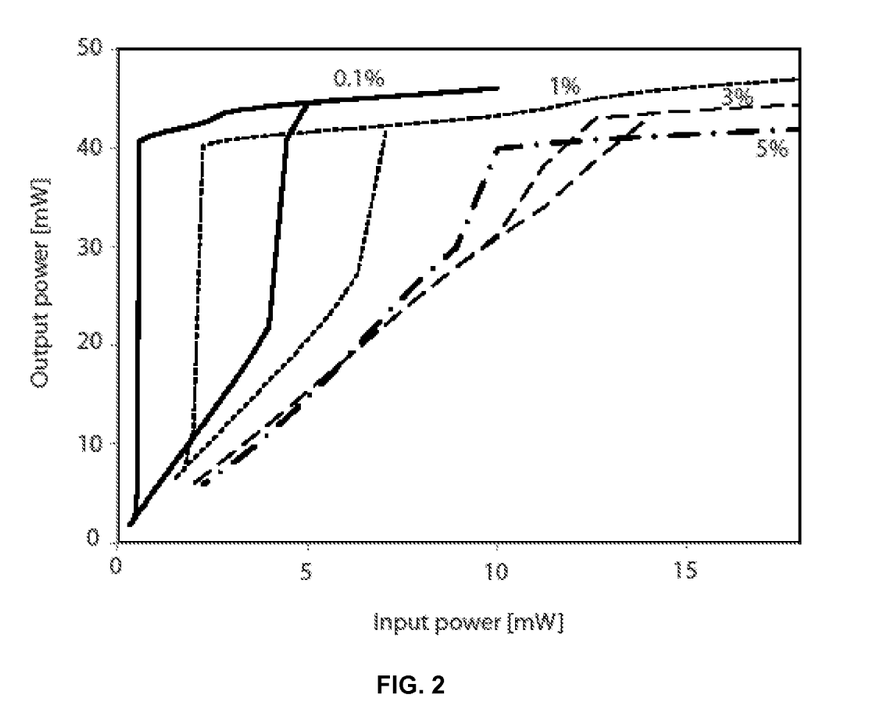
FIG. 2 shows simulation results, illustrating the output power versus input power of a DFB laser diode for different reflectivities at the antireflection coatings of the laser.

Operation of a DFB laser diode in the bistable regime can be obtained when the reflection at the antireflection coatings at both facets of the laser are sufficiently low, e.g. lower than 5%, preferably lower than 3%, more preferably lower than 2%, and still more preferably lower than 1%. This is illustrated in FIG. 2, showing simulation results of the output power versus the injected input power at the same wavelength for different reflectivity values (0.1%, 1%, 3% and 5%) of the antireflection coatings at both facets of the laser. In the simulations a laser length L of 400 μm, a κL value of 1.6 and an injection current of 150 mA was assumed. In the example shown, good bistable characteristics are obtained for the lowest reflectivity values but at a reflectivity of 3% the bistability is less pronounced. For higher reflectivity values the bistable regime may disappear.

The amount of reflectivity that can be tolerated also depends on other device parameters, such as for example the length of the laser and/or the coupling coefficient κ of the laser. For example, for lasers with lower length L and lower κ value, slightly higher reflectivities can be tolerated.

Figure 3:
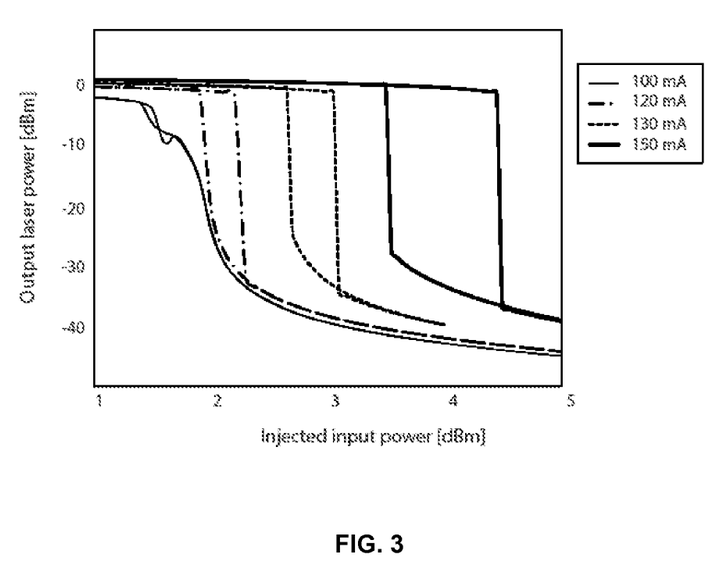
FIG. 3 shows the measured laser output power versus input power for different values of the injection current.

In addition, the injection current is preferably substantially higher than the threshold current for lasing, e.g. at least a factor of three higher, preferably at least a factor of four higher. This is illustrated in FIG. 3, wherein the measured laser output power versus input power is shown for different values of the injection current, for a laser with a threshold current of 30 mA, L=400 micrometer and κL=1.6. In the experiments an injection current from 100 mA to 150 mA was used. It can be seen that for the lowest injection current (100 mA) there is no clear hysteresis. For higher injection currents, e.g. in the range between 120 mA and 150 mA (being four to five times the threshold current), a clear hysteresis characteristic is observed.

When using a DFB laser diode having a bistable characteristic (counter-clockwise hysteresis curve) as described above for optical regeneration of an intensity modulated optical signal (comprising pulses having an upper power level and a lower power level), the lower power level of the pulses is preferably lower than the power level of the descending branch of the hysteresis curve and the upper power level of the pulses is preferably higher than the ascending branch of the hysteresis curve. This positioning of power levels can be obtained by the design of the laser diode, e.g. by selection of a suitable κL value wherein κ is the coupling coefficient and wherein L is the length of the laser. Positioning of the power levels can also be influenced by the injection current and the temperature. For example, increasing the current injection and/or tuning the temperature can move the hysteresis to higher power levels and/or can widen the hysteresis. Positioning of the power levels can also be obtained by providing an additional optical signal (a holding beam, e.g. a continuous wave optical signal) at the input of the DFB laser diode, thereby increasing the input power level. However, this requires an additional optical signal (and thus an additional light source). Different methods for power level positioning may be combined.

The method of the present disclosure can be used for regenerating an intensity modulated optical signal having a wavelength within the gain bandwidth of the DFB laser diode and sufficiently far away, e.g. 1 nm away, from the lasing wavelength. The injected light can have any wavelength outside the stopband of the DFB grating (and within the gain bandwidth), resulting in broadband operation of the 2R regenerator, i.e. an operation within a wavelength band with a width of 30 nm to 40 nm.

In operation, preferably a DC current is provided to the DFB laser diode and the optical signal to be regenerated is provided at the input of the DFB laser diode. At the output of the laser diode, the regenerated signal is formed. A filter can be provided at the output of the DFB laser diode to filter out the lasing wavelength, i.e. to reject the laser light.

Figure 4:
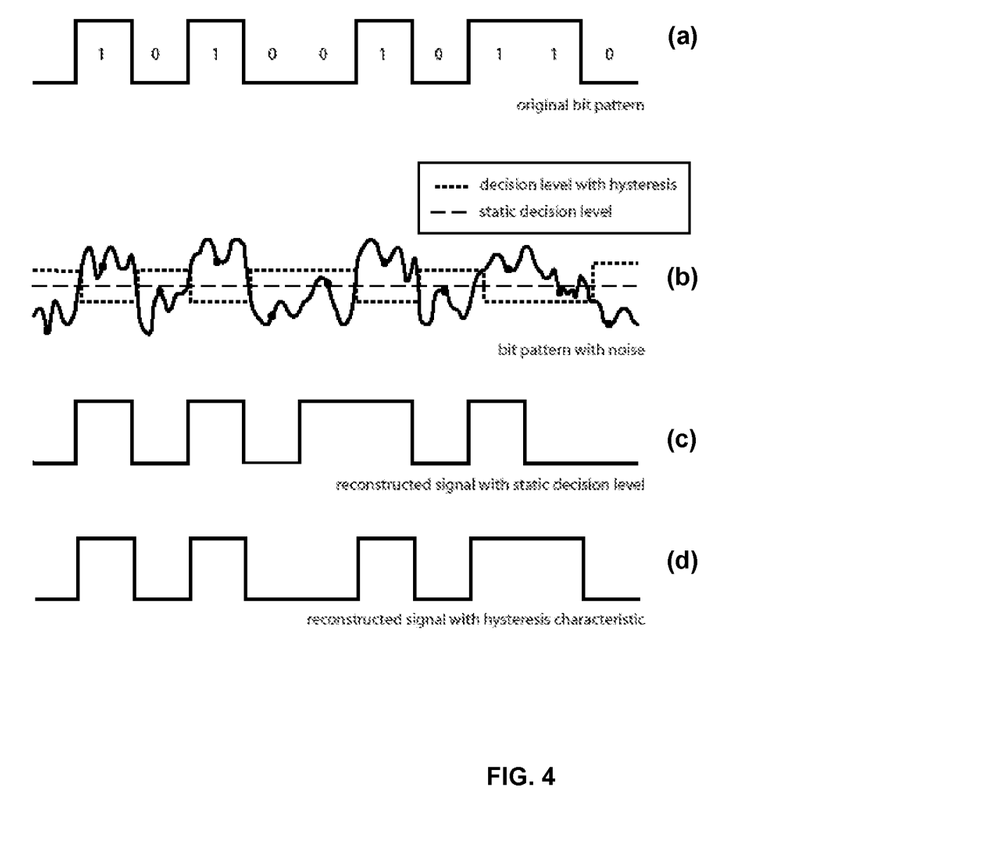
FIG. 4 schematically illustrates the effect of using a hysteresis for 2R regeneration.

It is an advantage of a method according to the present invention that fast and good optical regeneration can be obtained using a compact device. Although a bistable element (DFB laser diode) is used for providing optical regeneration, optical regeneration can occur at a high speed, e.g. in the range between 25 Gb/s and 40 Gb/s, because of the absence of complete ON/OFF switching of the device. As opposed to prior art solutions, wherein a fixed decision level is used for the zero's and ones, the hysteresis used in embodiments of the present disclosure causes the decision level to change dynamically and therefore reduces the BER of a noisy signal. This is illustrated in FIG. 4. FIG. 4(a) shows the original bit pattern and FIG. 4(b) shows the degraded bit pattern with a dynamically changing decision level (short dashes) and with a static decision level (long dashes). FIG. 4(c) illustrates the reconstructed or regenerated bit pattern based on the static decision level according to the prior art, showing errors in the regenerated signal. FIG. 4(d) illustrates the regenerated bit pattern based on a dynamic decision level in accordance with the present disclosure, showing a bit error free regeneration. Thus, in embodiments of the present disclosure the bistable transmission characteristic of the injected light is used to improve the bit error rate.

Figure 5:
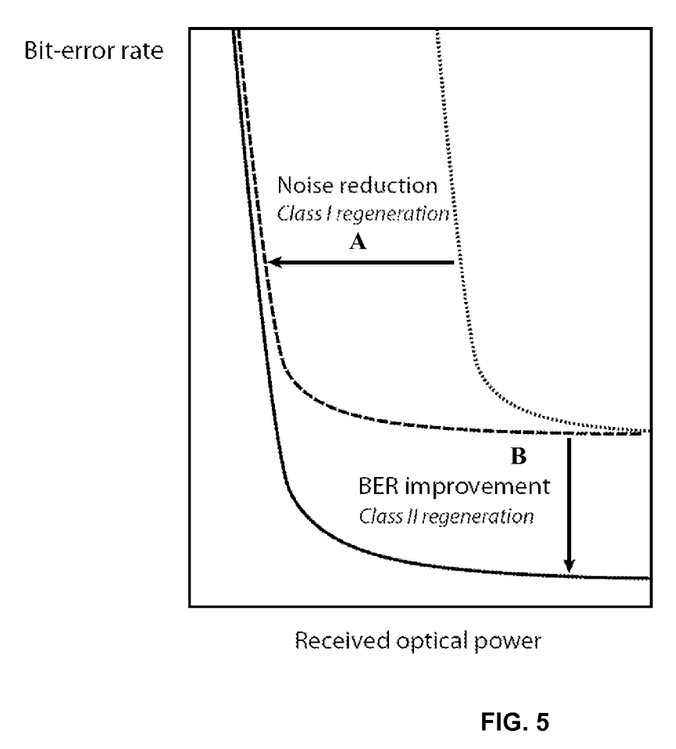
FIG. 5 illustrates the difference between noise reduction and BER improvement in a bit-error rate versus received optical power graph for class I and class II regeneration.

FIG. 5 illustrates the difference in regeneration using a static single threshold decision level and a dynamically moving decision characteristic (as in the present disclosure), in terms of BER versus received optical power. The static single threshold decision level leads to a reduction of the noise on the logical ones and/or logical zeros and a redistribution of the noise to allow error free detection at lower optical power values (horizontal shift A in FIG. 5). However, even with a step-like regenerator it is not possible to improve the bit error floor of the signal. Only regeneration schemes with a different transfer function for the ones and zeros can improve the bit error floor (vertical shift B in FIG. 5). This is for example the case with Mamyshev-type regenerators and with regenerators according to the present disclosure.

Figure 6:
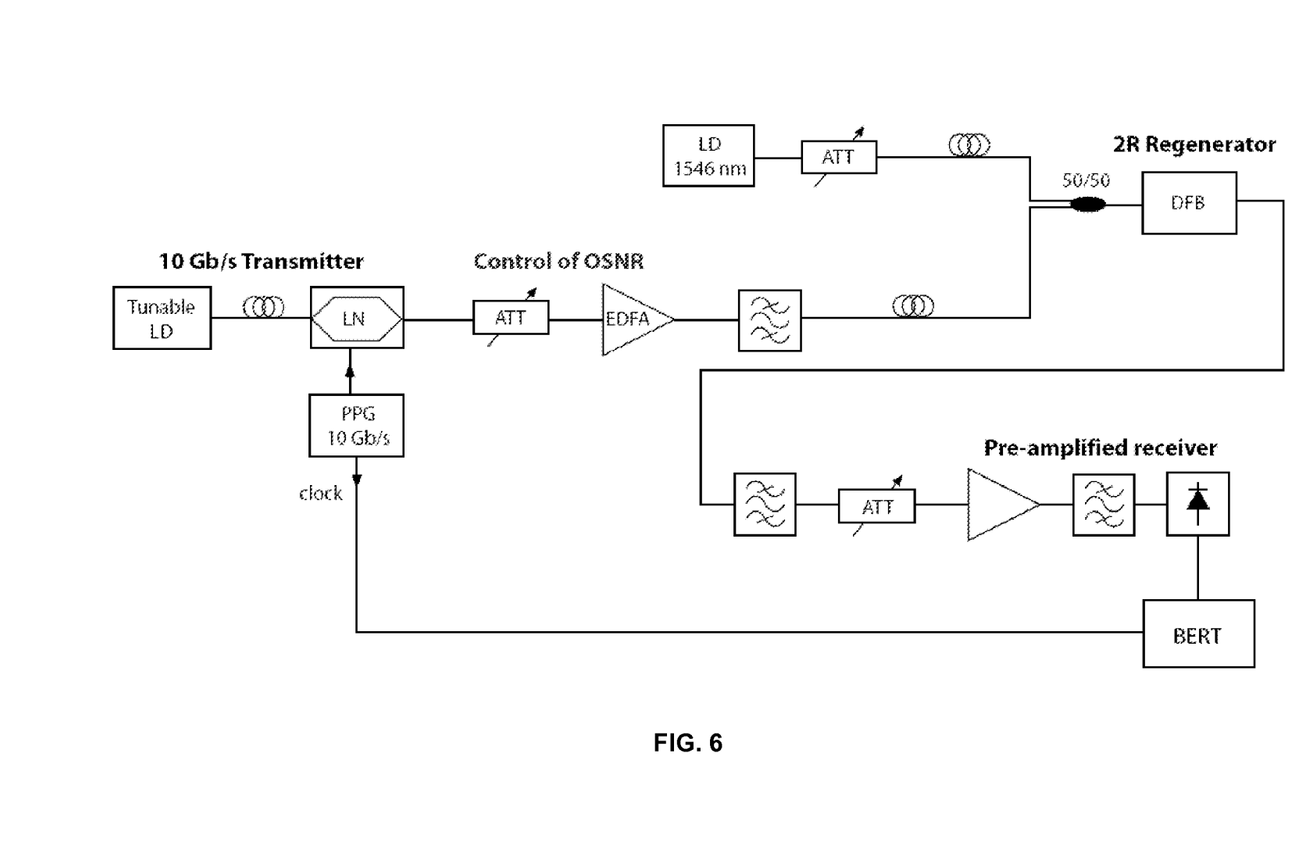
FIG. 6 shows a measurement set-up used in experiments for characterizing an optical regenerator according to the present disclosure.

Experiments were performed, using a set-up as shown in FIG. 6. A pulse pattern generator (PPG) generates a pseudo-random bit-sequence (PRBS) of $2^{31}$-1 bits with a bit rate of 10 Gb/s in a first experiment and with a bit rate of 25 Gb/s in a second experiment. The original signal is being attenuated and amplified by means of an Erbium Doped Fiber Amplifier (EDFA) to increase the Optical Signal to Noise Ratio (OSNR). The optical regenerator is a standard, non-optimized λ/4-shifted DFB laser diode with a lasing wavelength of 1553 nm from Alcatel-Thales with AR-coated facets. It has a κL value of 1.6 and a bias current of 150 mA. Lensed fibers are aligned at both sides of the laser to couple in the light. The degenerated signal from the EDFA is combined with a holding beam of 5 dBm (generated by a laser diode with wavelength 1546 nm) which is used to decrease the threshold for bistability and can be adjusted by an attenuator (ATT). An optical band-pass filter with a width of 1 nm removes the lasing light from the regenerated signal so that only the signal at the original wavelength is sent to the pre-amplified receiver for a BER analysis. A variable attenuator is used to change the received optical power on the receiver in order to make BER-diagrams.

Figure 7:
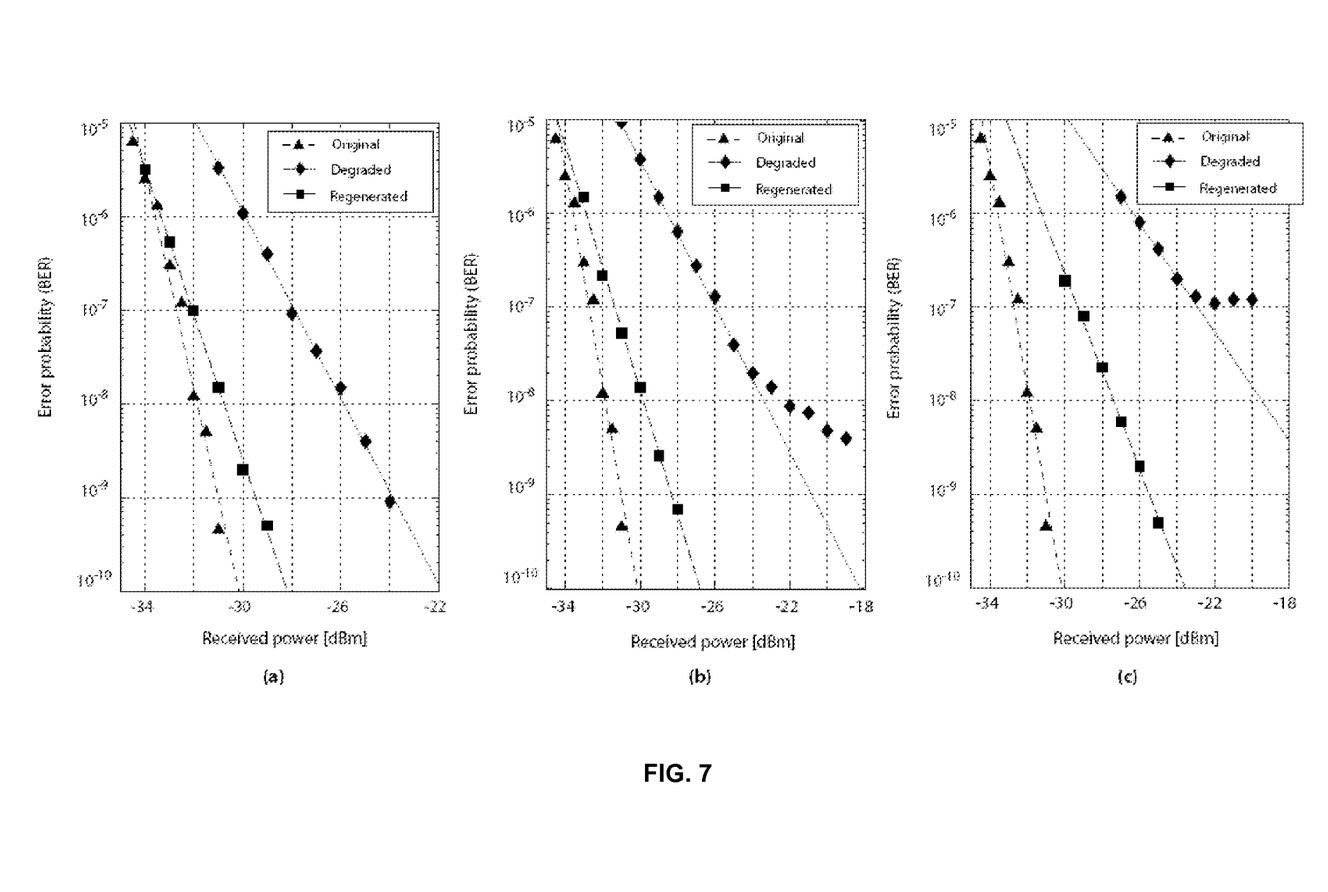
FIG. 7 shows the measured BER as a function of the received optical power for different values of the OSNR at a bitrate of 10 Gb/s.
Figure 8:
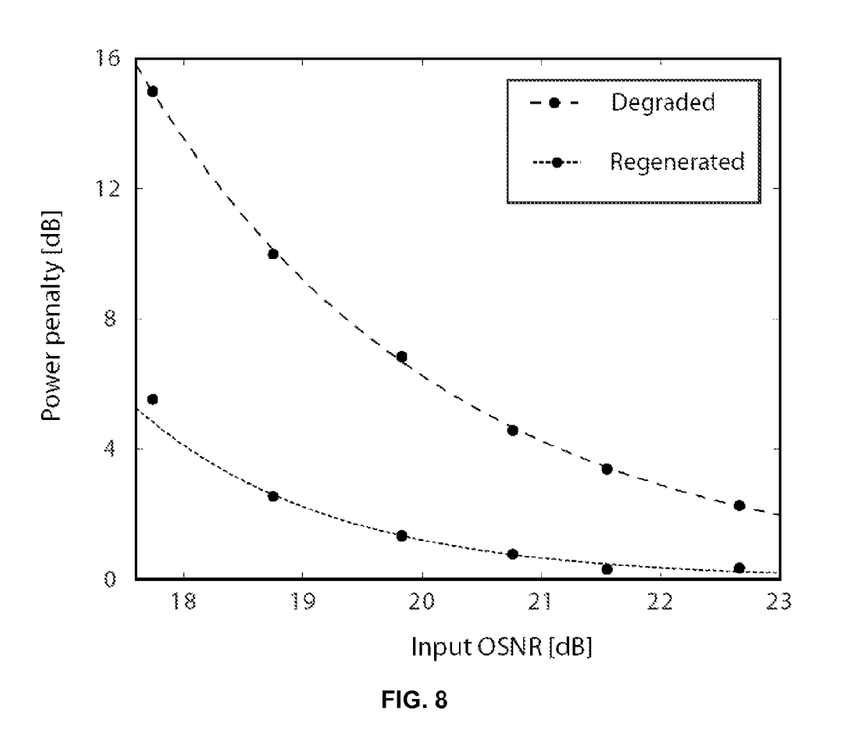
FIG. 8 shows the excess penalty for a BER of $10^{-9}$ of the degraded and regenerated signal compared to the original signal as a function of the EDFA input power.
Figure 9:
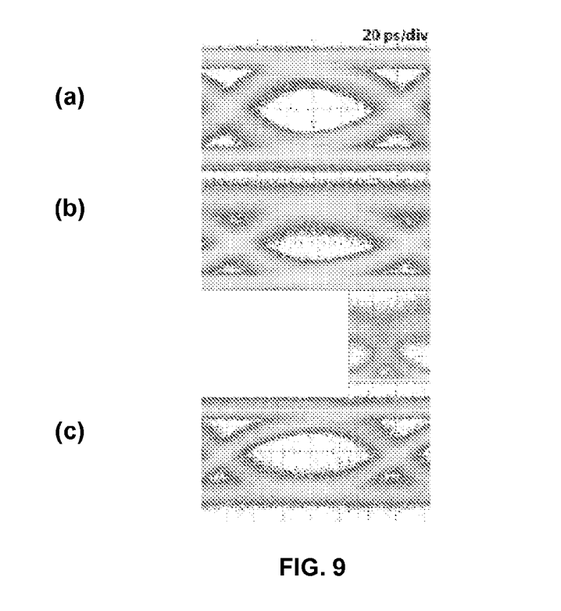
FIG. 9 compares the eye diagram of original, degraded, and regenerated signals.

In FIG. 7(a), FIG. 7(b) and FIG. 7(c), the BER diagrams as a function of the received optical power at the output of the DFB laser diode are shown for different values of the EDFA input power (and thus for different OSNR's). From these diagrams, it is clear that the 2R regenerator is able to improve the degraded signal significantly. Its noise suppression capabilities are demonstrated by FIG. 8 where the excess power penalty for the regenerated and degraded signal compared to the original signal are depicted as a function of the EDFA input power. The excess power penalty is the difference in input power needed at the receiver to obtain a bit error rate of $10^{-9}$. This difference is a measure of noise in the signal. The corresponding eye diagrams for the regeneration are depicted in FIG. 9(a) to FIG. 9(c). FIG. 9(a) shows the eye diagram of the original signal at the receiver; FIG. 9(b) shows the eye diagram of the degraded signal; FIG. 9(c) shows the eye diagram of the regenerated signal.

Figure 10:
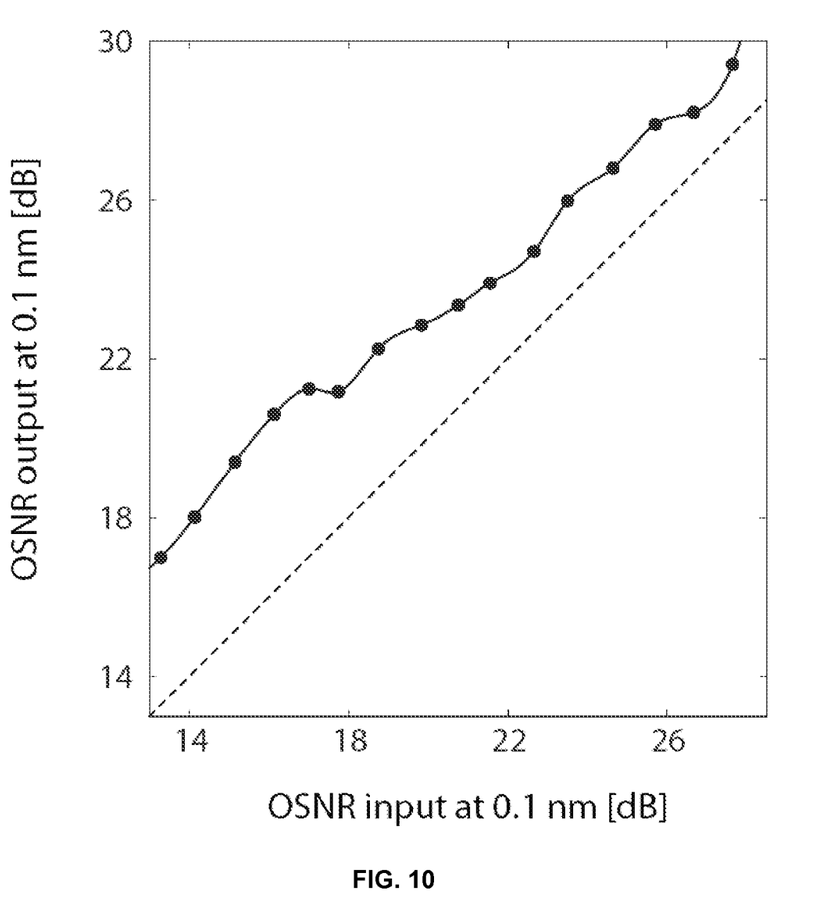
FIG. 10 shows the OSNR at the input and output of an all-optical regenerator according to an embodiment of the present disclosure as a function of the input power to the EDFA at a bitrate of 10 Gb/s.

In FIG. 10, the OSNR at the input and at the output of the 2R regenerator is depicted as a function of the input power to the EDFA for a bit rate of 10 Gb/s. The OSNR is measured by setting the resolution of the spectrum analyzer to 0.1 nm and determining the difference between the signal and noise. It can be concluded that there is an improvement of the OSNR of several dB's, proving its noise reduction characteristics. The reduction of noise is important with regard to the cascadability of the regenerators.

Figure 11:
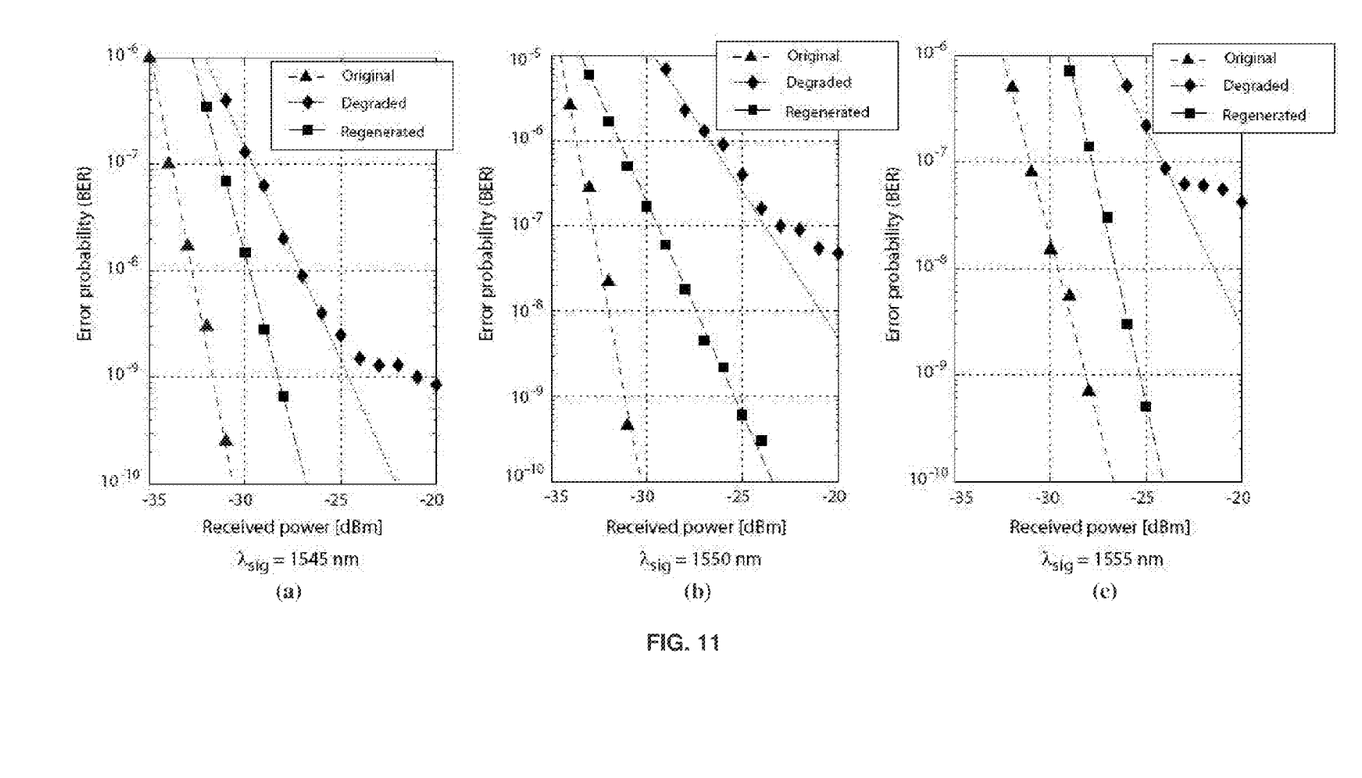
FIG. 11 shows the BER as a function of the received optical power for different transmission wavelengths at a bitrate of 10 Gb/s.

A 2R regenerator according to the present disclosure can work at any wavelength outside the stopband of the DFB grating and within the gain bandwidth as illustrated in FIG. 11. In FIG. 11, the measured BER diagrams for different injected wavelengths are shown (1545 nm, 1550 nm and 1555 nm), the measurements being performed with a DFB laser diode having a lasing wavelength of 1553 nm. This illustrates broadband operation that is only limited by the spectral width (e.g. several tens of nm, e.g. 30 nm to 50 nm) of the gain medium. The small differences between the graphs are mostly due to the spectral variation in gain of the EDFA.

A 2R regenerator with hysteresis according to embodiments of the present disclosure even reduces the BER when the degraded signal reaches the noise floor, determined by the OSNR. As can be seen for example in FIG. 7 and FIG. 11 (and further in FIG. 12), the BER curve of the regenerated signal has not only moved to the left (noise reduction) but has also a lower BER floor than the degraded signal. This is beyond the capabilities of regenerators with a single decision level.

Figure 12:
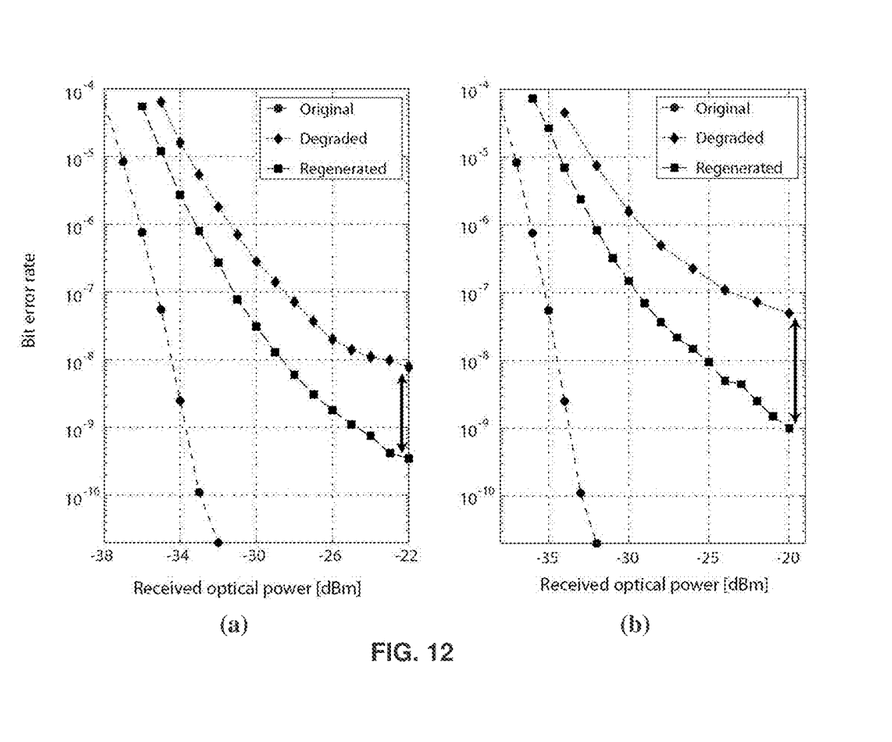
FIG. 12 shows the BER as a function of the received optical power at a bitrate of 25 Gb/s.
Figure 13:
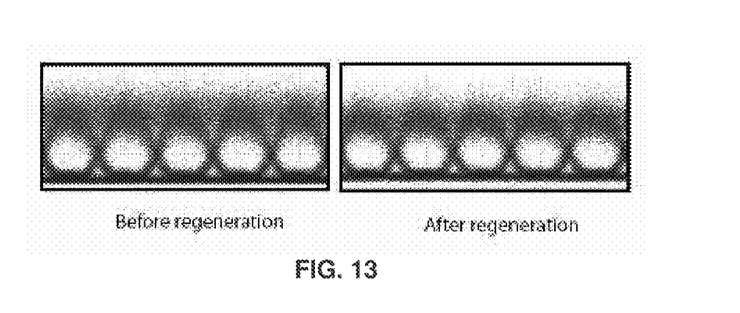
FIG. 13 shows the eye diagrams corresponding to FIG. 12(a).
Figure 14:
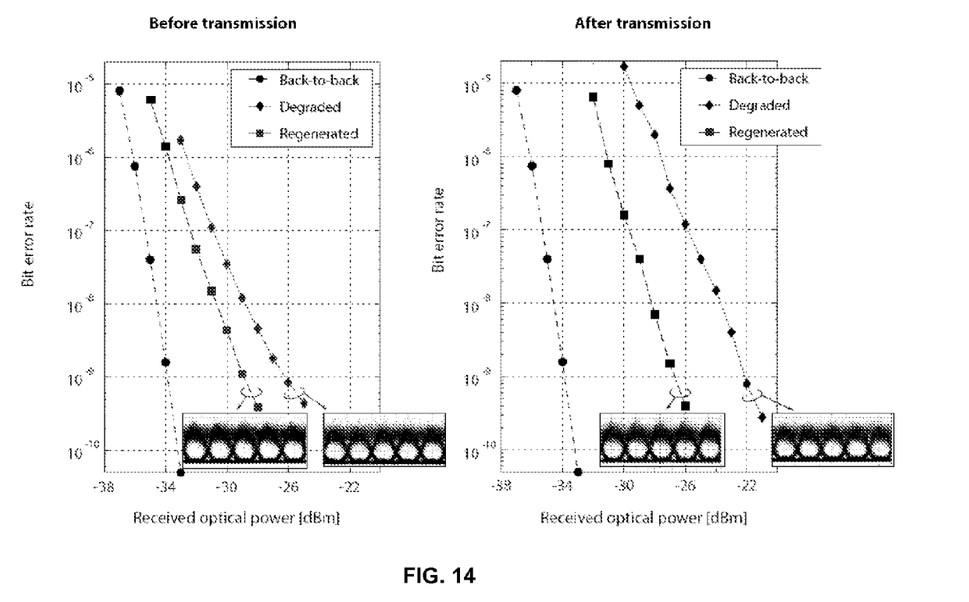
FIG. 14 illustrates the effectiveness of regeneration before and after transmission through an optical fiber link of 170 km.

Also at higher bit rates the regeneration properties of the all-optical regenerator of the present disclosure were observed. Whereas experimental results for a bit rate of 10 Gb/s are shown in FIG. 7 to FIG. 11, results obtained at a bit rate of 25 Gb/s are shown in FIG. 12, FIG. 13 and FIG. 14. Improved designs of the DFB laser diode, e.g. a DFB laser diode with a shorter length, lower coupling coefficient, higher differential gain or confinement factor, could lead to even faster operation, and regeneration at 40 Gb/s can be expected.

FIG. 12 shows the measured BER as a function of the received optical power at a bitrate of 25 Gb/s: FIG. 12(a) with an input OSNR of 17.6 dB (being improved to 19.8 dB); FIG. 12(b) with an input OSNR of 16.9 dB (being improved to 19.2 dB). A vertical shift of the BER curve after regeneration is observed. A BER improvement with a factor of 20 (FIG. 12(a)) and with a factor of 50 (FIG. 12(b)) is observed. FIG. 13 shows the eye diagrams corresponding to FIG. 12(a).

Semiconductor devices often introduce chirp or spectral broadening to an optical signal, thereby introducing additional dispersive effects in transmission over long optical fibers. In FIG. 14, results of the regeneration of a 25 Gb/s signal before and after transmission through a 170 km long dispersion-compensated fiber link shows that the regeneration is still effective after transmission through such a long fiber link, i.e. after spectral broadening.

The present disclosure also relates to an all-optical signal regenerator using a DFB laser diode in accordance with a method of the present disclosure. The present disclosure provides an all-optical regenerator for regenerating an optical signal comprising pulses having an upper power level and a lower power level, the optical signal having a signal wavelength, wherein the regenerator comprises: a DFB laser diode having a gain bandwidth comprising the signal wavelength, wherein the signal wavelength is outside the stopband of the DFB laser diode, the DFB laser diode having a bistable amplification characteristic for the signal wavelength showing a hysteresis curve with an ascending branch and a descending branch, the ascending branch being located at a higher input power level than the descending branch; a drive circuit for supplying a drive current to the DFB laser diode such that it operates in the bistable amplification regime, wherein the descending branch of the hysteresis curve is located at an input power level above the lower power level of the pulses and wherein the ascending branch of the hysteresis curve is located at an input power level below the upper power level of the pulses.

Figure 15:
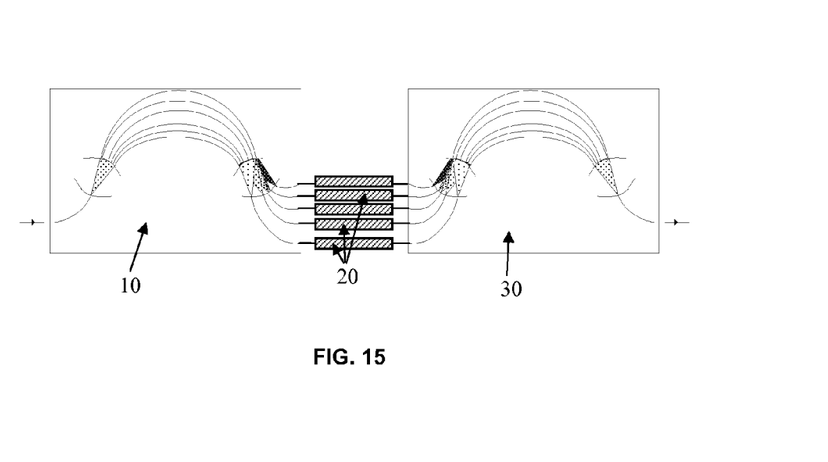
FIG. 15 schematically shows a multichannel all-optical 2R signal regenerator according to an embodiment of the present disclosure.

The present disclosure also relates to a multi-channel all-optical regenerator as for example illustrated in FIG. 15. The multi-channel regenerator comprises an input multiplexer 10 such as e.g. an arrayed waveguide grating multiplexer, an array of DFB laser diodes 20 driven according to a method of the present disclosure and an output demultiplexer 30, e.g. an arrayed waveguide grating demultiplexer. In such an embodiment, the multiplexer and the demultiplexer can also filter away the laser signal. Other multiplexers and/or demultiplexers known to a person skilled in the art can be used, such as e.g. (de)multiplexers based on ring resonators or based on Mach Zehnder interferometers.

The invention claimed is:

1. A method for all-optical regeneration of an optical signal comprising pulses having an upper power level and a lower power level, the optical signal having a signal wavelength, the method comprising:
   driving a DFB laser diode such that it operates in a bistable amplification regime, the laser diode having a gain bandwidth comprising the signal wavelength, wherein the signal wavelength is outside a stopband of the DFB laser diode, the DFB laser diode having a bistable amplification characteristic for the signal wavelength showing a hysteresis curve with an ascending branch and a descending branch, the ascending branch being located at a higher input power level than the descending branch, wherein the descending branch of the hysteresis curve is located at an input power level above the lower power level of the pulses and wherein the ascending branch of the hysteresis curve is located at an input power level below the upper power level of the pulses;
   directing the optical signal to an input of the DFB laser diode, thereby causing a regenerated optical signal, corresponding to the optical signal, to be generated at an output of the DFB laser diode; and optically filtering the regenerated optical signal at the output of the DFB laser diode by removing a laser wavelength of the DFB laser diode from the regenerated optical signal.

2. The method according to claim 1, wherein the DFB laser diode has an antireflection coating having a reflectivity lower than 5% at each facet.

3. The method according to claim 1, wherein the DFB laser diode has an antireflection coating having a reflectivity lower than 3% at each facet.

4. The method according to claim 1, wherein the DFB laser diode has an antireflection coating having a reflectivity lower than 1% at each facet.

5. The method according to claim 1, wherein driving the DFB laser diode comprises providing an injection current that is at least a factor of three higher than a threshold current of the DFB laser diode.

6. The method according to claim 1, further comprising providing a continuous optical signal at the input of the DFB laser diode for increasing the input power level.

7. An all-optical signal regenerator for regenerating an optical signal comprising pulses having an upper power level and a lower power level, the optical signal having a signal wavelength, wherein the regenerator comprises:
   a DFB laser diode having a gain bandwidth comprising the signal wavelength, wherein the signal wavelength is outside a stopband of the DFB laser diode, the DFB laser diode having a bistable amplification characteristic for the signal wavelength showing a hysteresis curve with an ascending branch and a descending branch, the ascending branch being located at a higher input power level than the descending branch;
   a drive circuit configured to supply a drive current to the DFB laser diode such that it operates in a bistable amplification regime, wherein the descending branch of the hysteresis curve is located at an input power level above the lower power level of the pulses and wherein the ascending branch of the hysteresis curve is located at an input power level below the upper power level of the pulses; and
   an optical filter configured to filter a regenerated signal at an output of the DFB laser diode by removing a laser wavelength of the DFB laser diode from the regenerated signal.

8. The all-optical signal regenerator according to claim 7, wherein the DFB laser diode has an antireflection coating having a reflectivity lower than 5% at each facet.

9. The all-optical signal regenerator according to claim 7, wherein the DFB laser diode has an antireflection coating having a reflectivity lower than 3% at each facet.

10. The all-optical signal regenerator according to claim 7, wherein the DFB laser diode has an antireflection coating having a reflectivity lower than 1% at each facet.

11. A multi-channel all-optical signal regenerator comprising an input multiplexer, a plurality of all-optical signal regenerators, and an output demultiplexer, each all-optical signal regenerator comprising:
   a DFB laser diode having a gain bandwidth comprising a signal wavelength of an input optical signal, wherein the signal wavelength is outside a stopband of the DFB laser diode, the DFB laser diode having a bistable amplification characteristic for the signal wavelength showing a hysteresis curve with an ascending branch and a descending branch, the ascending branch being located at a higher input power level than the descending branch, and the DFB laser diode having an optical filter configured to filter a regenerated signal at an output of the DFB laser diode by removing a laser wavelength of the DFB laser diode from the regenerated signal; and
   a drive circuit configured to supply a drive current to the DFB laser diode such that it operates in a bistable amplification regime, wherein the descending branch of the hysteresis curve is located at an input power level above the lower power level of the pulses and wherein the ascending branch of the hysteresis curve is located at an input power level below the upper power level of the pulses.

12. The multi-channel all-optical signal regenerator according to claim 11, wherein each DFB laser diode has an antireflection coating having a reflectivity lower than 5% at each facet.

13. The multi-channel all-optical signal regenerator according to claim 11, wherein each DFB laser diode has an antireflection coating having a reflectivity lower than 3% at each facet.

14. The multi-channel all-optical signal regenerator according to claim 11, wherein each DFB laser diode has an antireflection coating having a reflectivity lower than 1% at each facet.

* * * * *